(12) United States Patent
Hui et al.

(10) Patent No.: US 12,438,523 B2
(45) Date of Patent: Oct. 7, 2025

(54) CROSSOVER REDUCTION FOR ACOUSTIC DUPLEXERS BY SPURIOUS MODES

(71) Applicant: SKYWORKS SOLUTIONS, INC., Irvine, CA (US)

(72) Inventors: Yu Hui, Pleasanton, CA (US); Yiliu Wang, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 303 days.

(21) Appl. No.: 18/164,133

(22) Filed: Feb. 3, 2023

(65) Prior Publication Data

US 2023/0253953 A1 Aug. 10, 2023

Related U.S. Application Data

(60) Provisional application No. 63/307,685, filed on Feb. 8, 2022.

(51) Int. Cl.
| | | |
|---|---|---|
| *H03H 9/72* | (2006.01) | |
| *H03H 9/02* | (2006.01) | |
| *H03H 9/17* | (2006.01) | |
| *H03H 9/25* | (2006.01) | |
| *H03H 9/56* | (2006.01) | |
| *H03H 9/64* | (2006.01) | |
| *H03H 9/70* | (2006.01) | |

(52) U.S. Cl.
CPC ........ *H03H 9/725* (2013.01); *H03H 9/02834* (2013.01); *H03H 9/172* (2013.01); *H03H 9/25* (2013.01); *H03H 9/564* (2013.01); *H03H 9/568* (2013.01); *H03H 9/6483* (2013.01); *H03H 9/706* (2013.01)

(58) Field of Classification Search
CPC .... H03H 9/725; H03H 9/02834; H03H 9/172; H03H 9/25; H03H 9/564; H03H 9/568; H03H 9/6483; H03H 9/706; H03H 9/02102; H03H 9/02157; H03H 9/02228; H03H 9/02559; H03H 9/02118
See application file for complete search history.

(56) References Cited

U.S. PATENT DOCUMENTS

| | | |
|---|---|---|
| 11,451,212 B2 | 9/2022 | Komatsu et al. |
| 11,563,423 B2 | 1/2023 | Komatsu et al. |
| 2007/0030096 A1* | 2/2007 | Nishihara ............. H03H 9/605 333/133 |
| 2011/0018653 A1* | 1/2011 | Bradley ................ H03H 9/706 333/133 |

(Continued)

*Primary Examiner* — John W Poos
(74) *Attorney, Agent, or Firm* — Lando & Anastasi, LLP

(57) ABSTRACT

A radio frequency duplexer comprises a transmit filter including a first plurality of acoustic wave resonators, and a receive filter including a second plurality of acoustic wave resonators. The transmit filter exhibits a transmit insertion loss curve that partially overlaps with a receive insertion loss curve of the receive filter, a frequency range of the overlap of the transmit insertion loss curve and receive insertion loss curve defining a frequency range of crossover of the duplexer. At least one of the first plurality of acoustic wave resonators or the second plurality of acoustic wave resonators include a structure configured to generate a spurious signal at a frequency within the frequency range of the crossover to reduce an amplitude of an interference signal within the frequency range of the crossover.

20 Claims, 17 Drawing Sheets

(56) References Cited

U.S. PATENT DOCUMENTS

| | | | | |
|---|---|---|---|---|
| 2011/0128092 A1* | 6/2011 | Fritz | ............... | H04B 1/52 333/133 |
| 2020/0028487 A1* | 1/2020 | Caron | ............... | H03H 9/706 |
| 2022/0200572 A1 | 6/2022 | Wang et al. | | |

* cited by examiner

CROSSOVER REDUCTION FOR ACOUSTIC DUPLEXERS BY SPURIOUS MODES

CROSS-REFERENCE TO RELATED APPLICATIONS

This application claims priority under 35 U.S.C. § 119(e) to U.S. Provisional Patent Application Ser. No. 63/307,685, titled "CROSSOVER REDUCTION FOR ACOUSTIC DUPLEXERS BY SPURIOUS MODES," filed Feb. 8, 2022, the entire content of which is incorporated herein by reference for all purposes.

BACKGROUND

Technical Field

Embodiments of this disclosure relate to acoustic wave devices and to duplexers including same.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile telephone can include acoustic wave filters. Two acoustic wave filters can be arranged as a duplexer or a diplexer.

SUMMARY

In accordance with one aspect, there is provided a radio frequency duplexer. The radio frequency duplexer comprises a transmit filter including a first plurality of acoustic wave resonators, and a receive filter including a second plurality of acoustic wave resonators. The transmit filter exhibits a transmit insertion loss curve that partially overlaps with a receive insertion loss curve of the receive filter, a frequency range of the overlap of the transmit insertion loss curve and receive insertion loss curve defining a frequency range of crossover of the duplexer. At least one of the first plurality of acoustic wave resonators or the second plurality of acoustic wave resonators include a structure configured to generate a spurious signal at a frequency within the frequency range of the crossover to reduce an amplitude of an interference signal within the frequency range of the crossover.

In some embodiments, the structure includes a surface acoustic wave resonator of one of the first or second plurality of acoustic wave resonators formed with a piezoelectric substrate having a cut angle configured to generate a shear horizontal mode spurious signal having the frequency within the frequency range of the crossover.

In some embodiments, the structure includes a plurality of surface acoustic wave resonators of the one of the first or second plurality of acoustic wave resonators formed with the piezoelectric substrate having the cut angle configured to generate shear horizontal mode spurious signals having a plurality of frequencies within the frequency range of the crossover.

In some embodiments, the one of the transmit or receive filters comprises a ladder filter.

In some embodiments, the plurality of surface acoustic wave resonators of the one of the first or second plurality of acoustic wave resonators are series resonators of the ladder filter.

In some embodiments, the structure includes different ones of the surface acoustic wave resonator of one of the first or second plurality of acoustic wave resonators including temperature compensation layers with different thicknesses.

In some embodiments, the structure includes a surface acoustic wave resonator of one of the first or second plurality of acoustic wave resonators including a temperature compensation layer and a layer of high velocity material disposed within the temperature compensation layer and exhibiting a greater acoustic velocity than a material of the temperature compensation layer.

In some embodiments, the structure includes a plurality of surface acoustic wave resonators of the one of the first or second plurality of acoustic wave resonators including a temperature compensation layer and a layer of the high velocity material disposed within the temperature compensation layer.

In some embodiments, thicknesses of the layers of high velocity material in different ones of the plurality of surface acoustic wave resonators of the one of the first or second plurality of acoustic wave resonators are different.

In some embodiments, the one of the transmit or receive filters comprises a ladder filter.

In some embodiments, the plurality of surface acoustic wave resonators of the one of the first or second plurality of acoustic wave resonators are series resonators of the ladder filter.

In some embodiments, the structure includes a surface acoustic wave resonator of one of the first or second plurality of acoustic wave resonators including an aperture having a width of 10λ or less.

In some embodiments, the surface acoustic wave resonator of the one of the first or second plurality of acoustic wave resonators generates spurious transverse mode signals at more than one frequency.

In some embodiments, the surface acoustic wave resonator of the one of the first or second plurality of acoustic wave resonators lacks structures configured to cause the surface acoustic wave resonator to operate in piston mode.

In some embodiments, the structure includes a plurality of surface acoustic wave resonators of the one of the first or second plurality of acoustic wave resonators including apertures having widths of 10λ or less.

In some embodiments, different ones of the plurality of surface acoustic wave resonators of the one of the first or second plurality of acoustic wave resonators including apertures having different widths.

In some embodiments, the structure includes a bulk acoustic wave resonator of one of the first or second plurality of acoustic wave resonators including a piezoelectric film, an active region, and a recessed frame region surrounding the active region, the recessed frame region having a recessed frame structure disposed on the piezoelectric film, the active region having an active region structure disposed on the piezoelectric film, the recessed frame structure having a thickness greater than a thickness of the active region structure.

In some embodiments, the structure includes a plurality of bulk acoustic wave resonators of the one of the first or second plurality of acoustic wave resonators each of the plurality of bulk acoustic wave resonators of the one of the first or second plurality of acoustic wave resonators having recessed frame structures with different thicknesses.

In some embodiments, the structure includes a bulk acoustic wave resonator of one of the first or second plurality of acoustic wave resonators including a piezoelectric film, an active region, and a recessed frame region surrounding the active region, the recessed frame region having a recessed frame structure disposed on the piezoelectric film, the active region having an active region structure disposed on the piezoelectric film, the recessed frame structure having a thickness sufficiently less than a thickness of the active region structure to cause the bulk acoustic wave resonator to generate a spurious thickness extension mode signal at a frequency greater than a resonance frequency of the bulk acoustic wave resonator.

In some embodiments, the structure includes a plurality of bulk acoustic wave resonators of the one of the first or second plurality of acoustic wave resonators each of the plurality of bulk acoustic wave resonators of the one of the first or second plurality of acoustic wave resonators having recessed frame structures with different thicknesses and configured to generate spurious thickness extension mode signals at different frequencies greater than the resonance frequency of the bulk acoustic wave resonator.

In some embodiments, the duplexer is included in a radio frequency device module.

In some embodiments, the radio frequency device module is included in a radio frequency device.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
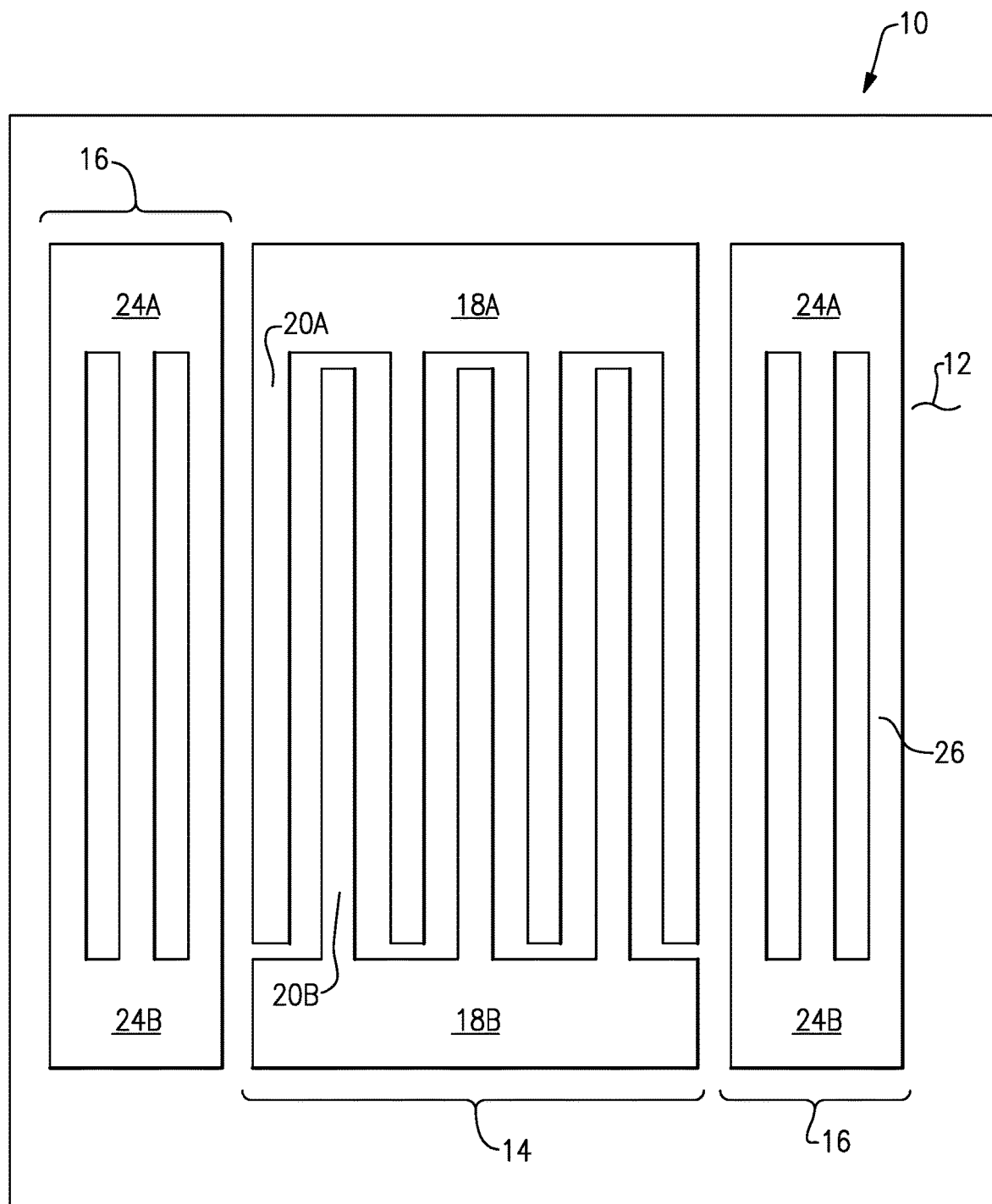
FIG. 1 is a simplified plan view of an example of a surface acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a plan view of a surface acoustic wave (SAW) resonator 10 such as might be used in a SAW filter, duplexer, diplexer, balun, etc.

Acoustic wave resonator 10 is formed on a piezoelectric substrate, for example, a lithium tantalate (LiTaO$_3$) or lithium niobate (LiNbO$_3$) substrate 12 and includes interdigital transducer (IDT) electrodes 14 and reflector electrodes 16. In use, the IDT electrodes 14 excite a main acoustic wave having a wavelength λ along a surface of the piezoelectric substrate 12. The reflector electrodes 16 sandwich the IDT electrodes 14 and reflect the main acoustic wave back and forth through the IDT electrodes 14. The main acoustic wave of the device travels perpendicular to the lengthwise direction of the IDT electrodes.

The IDT electrodes 14 include a first busbar electrode 18A and a second busbar electrode 18B facing first busbar electrode 18A. The busbar electrodes 18A, 18B may be referred to herein together as busbar electrode 18. The IDT electrodes 14 further include first electrode fingers 20A extending from the first busbar electrode 18A toward the second busbar electrode 18B, and second electrode fingers 20B extending from the second busbar electrode 18B toward the first busbar electrode 18A.

The reflector electrodes 16 (also referred to as reflector gratings) each include a first reflector busbar electrode 24A and a second reflector busbar electrode 24B (collectively referred to herein as reflector busbar electrode 24) and reflector fingers 26 extending between and electrically coupling the first busbar electrode 24A and the second busbar electrode 24B.

The surface of the SAW resonator, including the IDT electrodes 14 and reflector electrodes 16 may be covered with a layer or material with a thermal expansion coefficient having an opposite sign than the thermal expansion coefficient of the piezoelectric substrate 12, for example, silicon dioxide (SiO$_2$). The layer of SiO$_2$ acts as a thermal compensation layer by helping reduce the amount by which the dimensions of the substrate, and thus the resonant and anti-resonant frequencies of the resonator change with changes in temperature. A SAW resonator having such a temperature compensation layer may be referred to as a temperature compensated SAW resonator or TCSAW.

Figure 2:
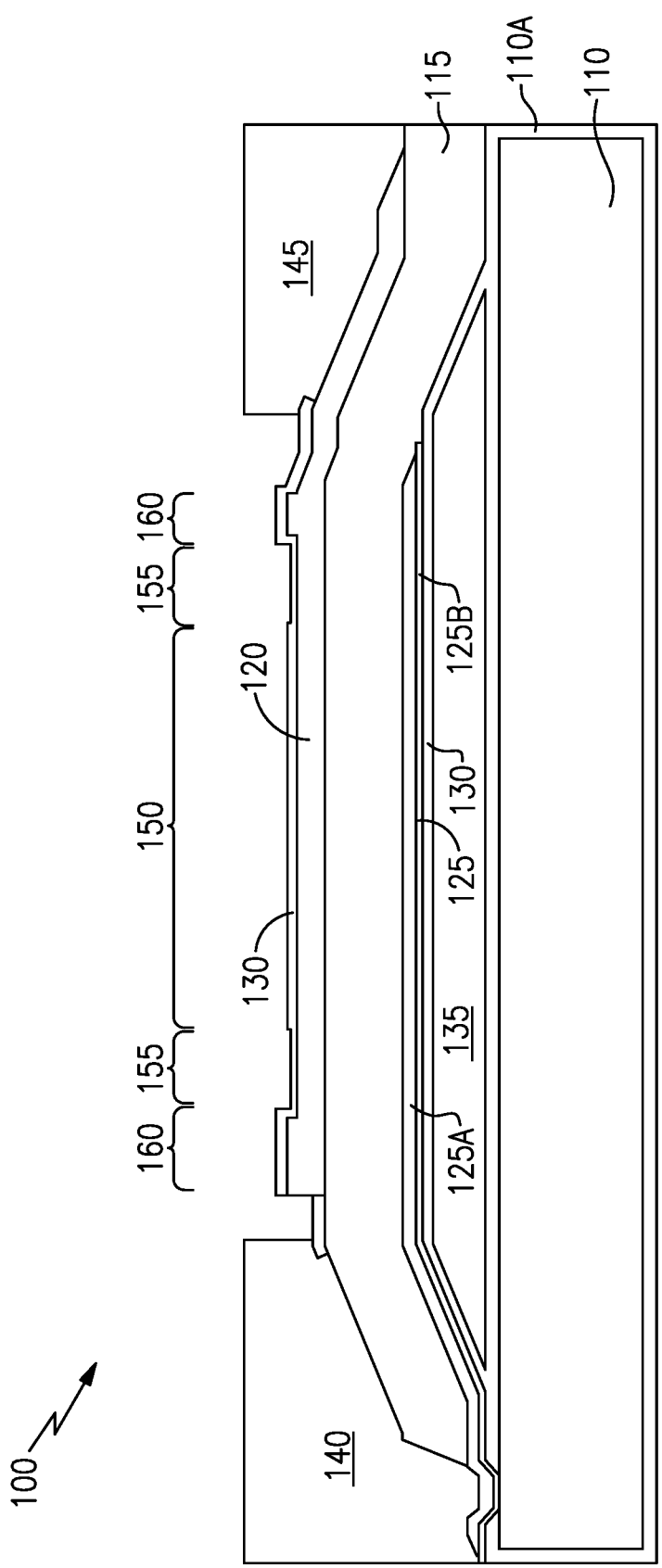
FIG. 2 is a simplified cross-sectional view of a bulk acoustic wave resonator having a film bulk acoustic wave configuration.

FIG. 2 is cross-sectional view of an example of a bulk acoustic wave resonator having a film bulk acoustic wave resonator (FBAR) configuration, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Another form of BAW resonator is a Lamb wave acoustic wave resonator. A Lamb wave resonator can combine features of a surface acoustic wave (SAW) resonator and a BAW resonator. A Lamb wave resonator typically includes an interdigital transducer (IDT) electrode similar to a SAW resonator. Accordingly, the frequency of the Lamb wave resonator can be lithographically defined. A Lamb wave resonator can achieve a relatively high quality factor (Q) and a relatively high phase velocity like a BAW resonator (e.g., due to a suspended structure). A Lamb wave resonator that includes an AlN piezoelectric layer can be relatively easy to integrate with other circuits, for example, because AlN process technology can be compatible with complementary metal oxide semiconductor (CMOS) process technology. AlN Lamb wave resonators can overcome a relatively low resonance frequency limitation and integration challenge associated with SAW resonators and also overcome multiple frequency capability challenges associated with BAW resonators. Some Lamb wave resonator topologies are based on acoustic reflection from periodic reflective gratings. Some other Lamb wave resonator topologies are based on acoustic reflection from suspended free edges of a piezoelectric layer.

Figure 3:
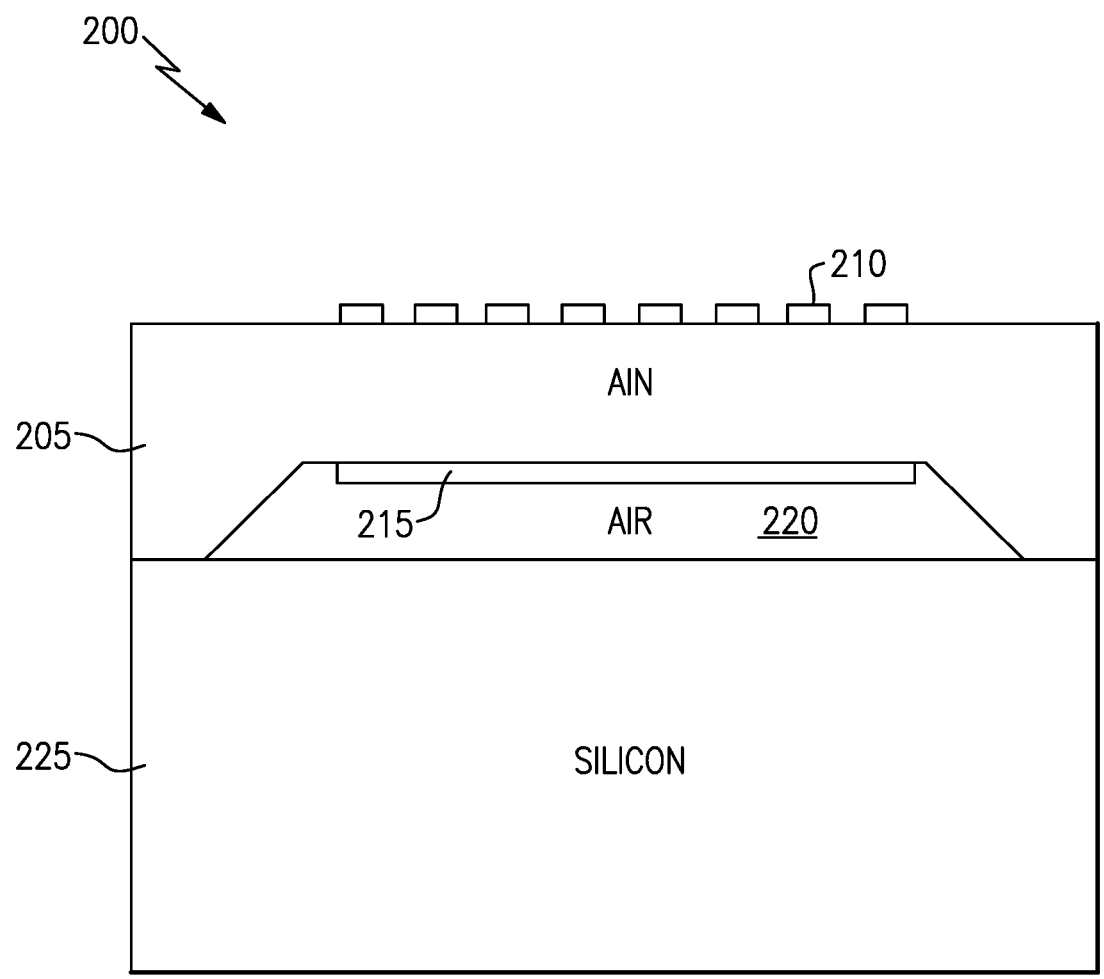
FIG. 3 is a simplified cross-sectional view of a bulk acoustic wave resonator having a Lamb wave resonator configuration.

An example of a Lamb wave acoustic wave resonator is indicated generally at 200 in FIG. 3. The Lamb wave resonator 200 includes features of a SAW resonator and an FBAR. As illustrated, the Lamb wave resonator 200 includes a piezoelectric layer 205, an interdigital transducer electrode (IDT) 210 on the piezoelectric layer 205, and a lower electrode 215 disposed on a lower surface of the piezoelectric layer 205. The piezoelectric layer 205 can be a thin film. The piezoelectric layer 205 can be an aluminum nitride layer. In other instances, the piezoelectric layer 205 can be any suitable piezoelectric layer. The frequency of the Lamb wave resonator can be based on the geometry of the IDT 210. The electrode 215 can be grounded in certain instances. In some other instances, the electrode 215 can be floating. An air cavity 220 is disposed between the electrode 215 and a semiconductor substrate 225. Any suitable cavity can be implemented in place of the air cavity 220, for example, a vacuum cavity or a cavity filled with a different gas.

Figure 4:
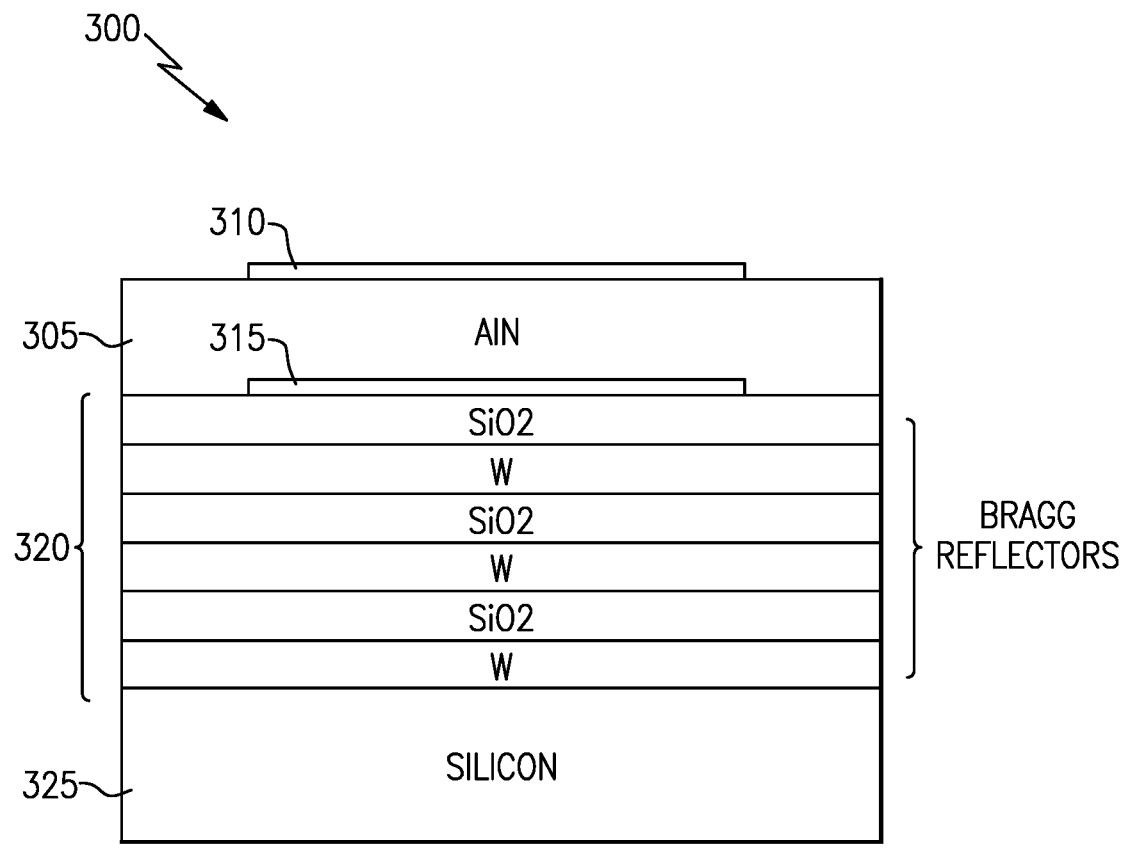
FIG. 4 is a simplified cross-sectional view of a bulk acoustic wave resonator having a solidly mounted resonator configuration.

Another form of BAW resonator is a surface mounted resonator (SMR). An example of an SMR is illustrated generally at 300 in FIG. 4. As illustrated, the SMR 300 includes a piezoelectric layer 305, an upper electrode 310 on the piezoelectric layer 305, and a lower electrode 315 on a lower surface of the piezoelectric layer 305. The piezoelectric layer 305 can be an aluminum nitride layer. In other instances, the piezoelectric layer 305 can be any other suitable piezoelectric layer. The lower electrode 315 can be grounded in certain instances. In some other instances, the lower electrode 315 can be floating. Bragg reflectors 320 are disposed between the lower electrode 315 and a semiconductor substrate 325. The semiconductor substrate 325 can be a silicon substrate. Any suitable Bragg reflectors can be implemented. For example, the Bragg reflectors can be $SiO_2$/W.

Examples of acoustic wave resonators as disclosed herein may be combined to form a duplexer for a radio frequency device, for example, a cellular telephone. One form of duplexer is a frequency division duplexer (FDD). A FDD includes a transmit filter and a receive filter that work at separate yet close frequencies, allowing sending and receiving data at the same time without interference between the signals including the sent and received data. For those frequency bands with a narrow transitioning gap between transmitting (Tx) and receiving (Rx) frequencies, there is risk of uplink (Tx) and downlink (Rx) signals interfering with each other through the crossover between the two. Filtering technology for RF communication devices is often based on acoustic wave filters such as disclosed herein, with surface acoustic wave (SAW) and bulk acoustic wave (BAW) resonators as the building blocks, thanks to their high quality factor (Q), small footprint, and low cost. Although Q of such resonators is high, a finite Q value still results in an imperfect filter slope from passband edge to rejection band edge. This filter slope from Tx and Rx filters creates Tx and Rx signal crossover which could potentially cause crosstalk interference between the two filters.

Figure 5:
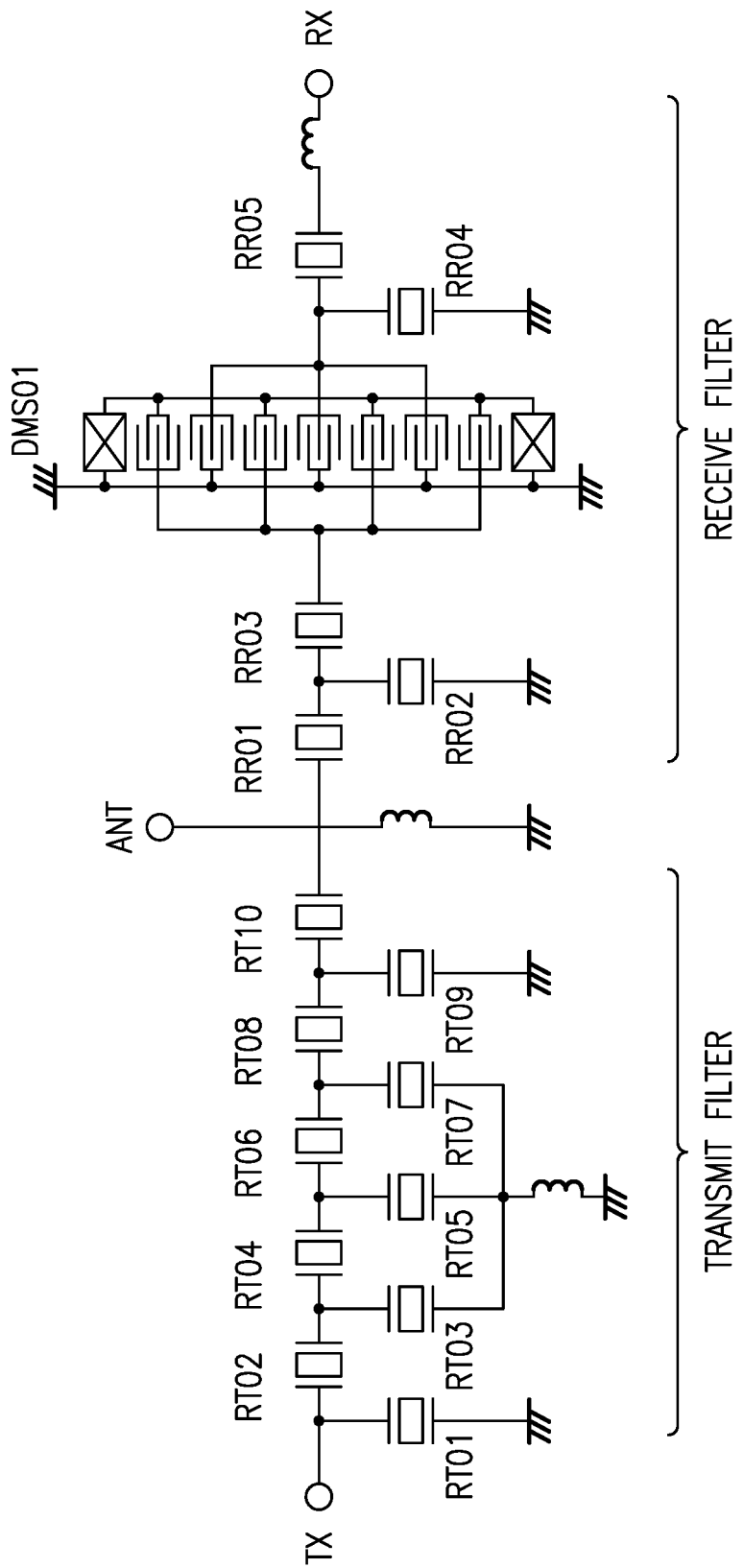
FIG. 5 is a simplified circuit schematic of an example of a duplexer.

A simplified circuit diagram for one example of a frequency division duplexer (hereinafter, referred to as simply a duplexer) is illustrated in FIG. 5. The duplexer includes an antenna port ANT, and transmitter port TX, and a receiver port RX. Transmitter circuitry (not illustrated) connected to the TX port provides a signal that is sent to the ANT port for transmission. Signals received at the ANT port pass to receiver circuitry (not illustrated) connected to RX port for processing. Transmission and receive signals occupy different frequency bands. For example, for the B20 LTE band the transmit signals occupy the frequency band of 832-862 MHz and the receive signals occupy the frequency band of 791-821 MHz. It is typically undesirable for signals in the receive band to enter the transmitter circuitry or for signals in the transmit band to enter the receiver circuitry of a wireless device because this may reduce the signal to noise ratio of the transmission or receive signals and cause undesirable signal interference. Accordingly, in the duplexer, there is a transmit filter between the TX and ANT ports that ideally passes only signals within the transmit band and blocks signals within the receive band from passing into the transmitter circuitry. There is also a receive filter between the RX and ANT ports that ideally passes only signals within the receive band and blocks signals within the transmit band from passing into the receive circuitry. The transmit and receive filters may include a plurality of resonators as disclosed herein, for example, one or more SAW, FBAR, Lamb wave, and/or SMR resonators. The choice of resonator type and filter circuitry configuration may depend on factors such as operating frequency, operating power, desired signal to noise ratio, or other desired or specified operating parameters of the duplexer.

Figure 6A:
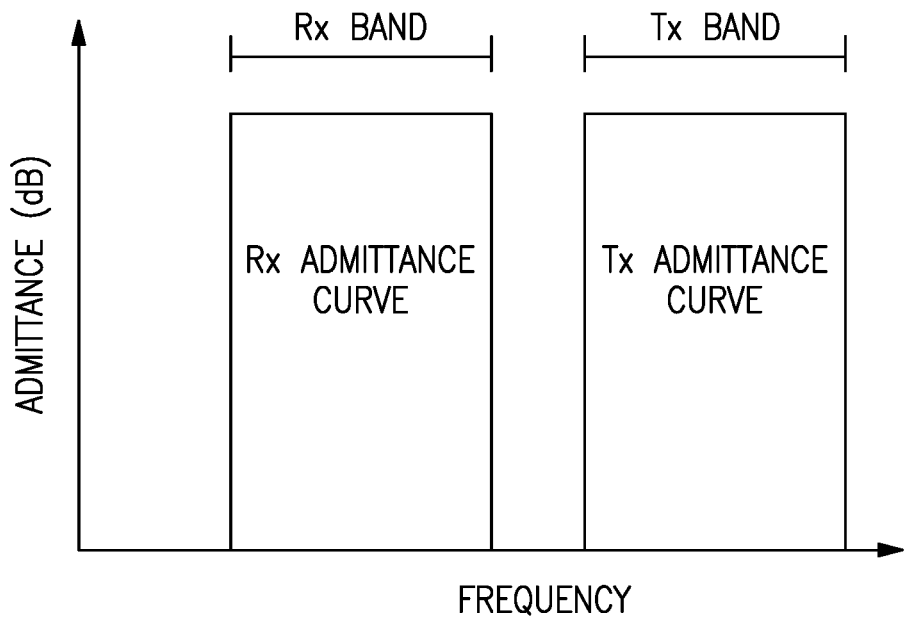
FIG. 6A schematically illustrates admittance curves of ideal transmit and receive filters in a duplexer.
Figure 6B:
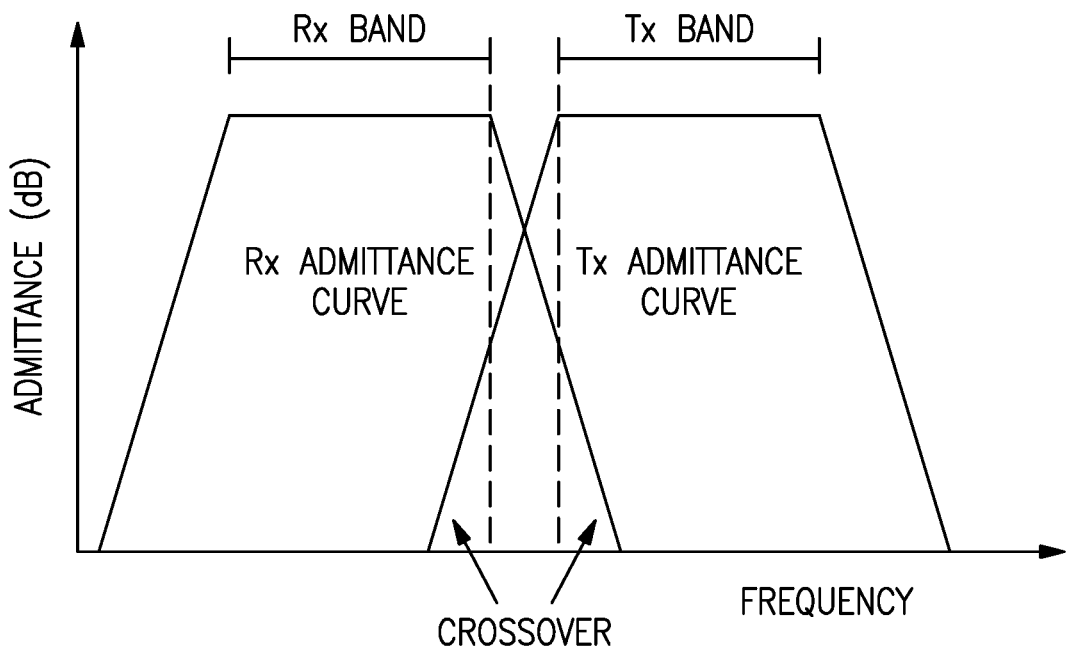
FIG. 6B schematically illustrates admittance curves of real-world transmit and receive filters in a duplexer.
Figure 7A:
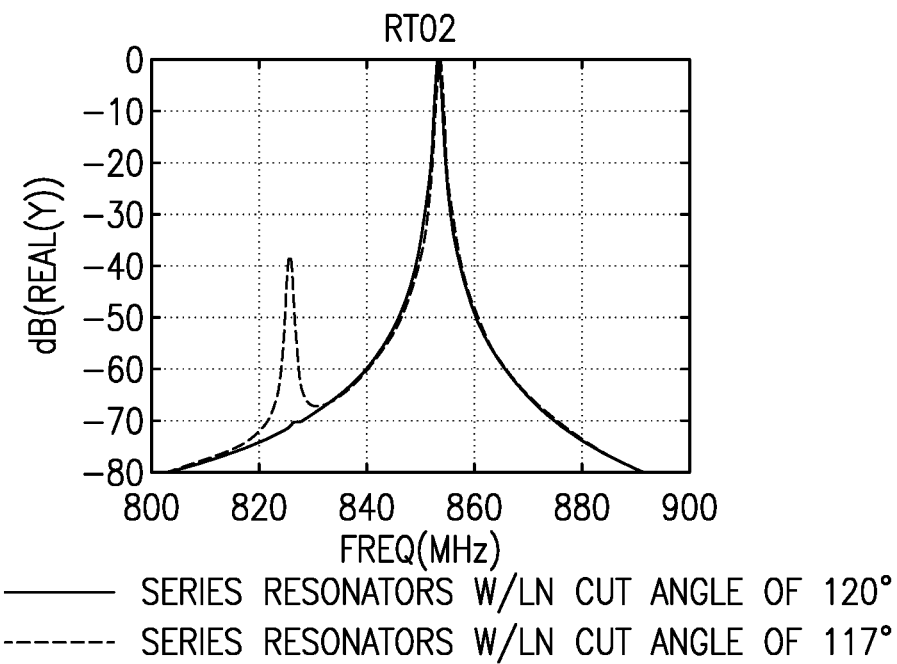
FIG. 7A illustrates a comparison between frequency responses of a first series resonator of a transmit filter of a duplexer formed on piezoelectric substrates having different cut angles.
Figure 7B:
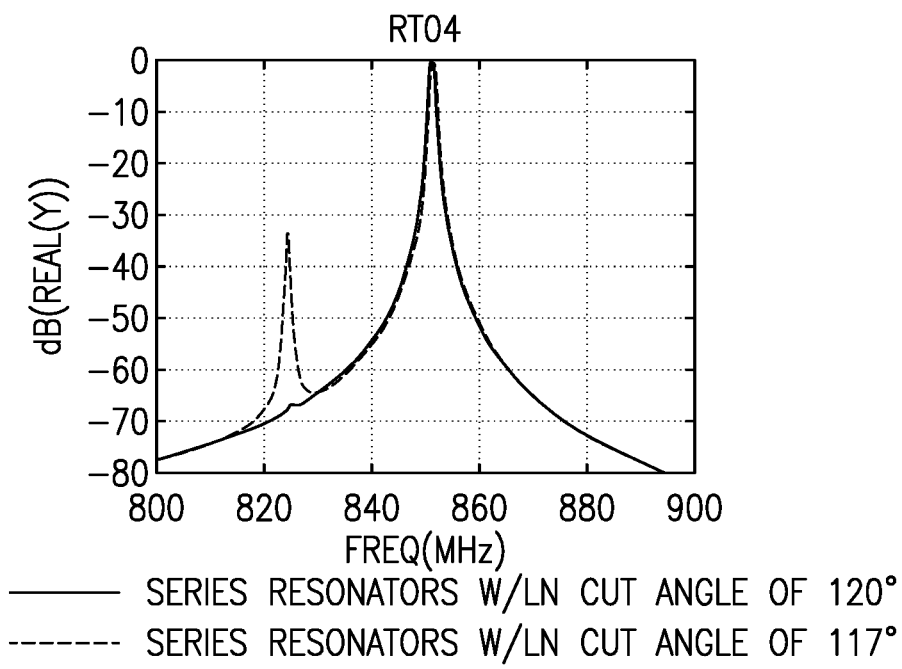
FIG. 7B illustrates a comparison between frequency responses of a second series resonator of a transmit filter of a duplexer formed on piezoelectric substrates having different cut angles.
Figure 7C:
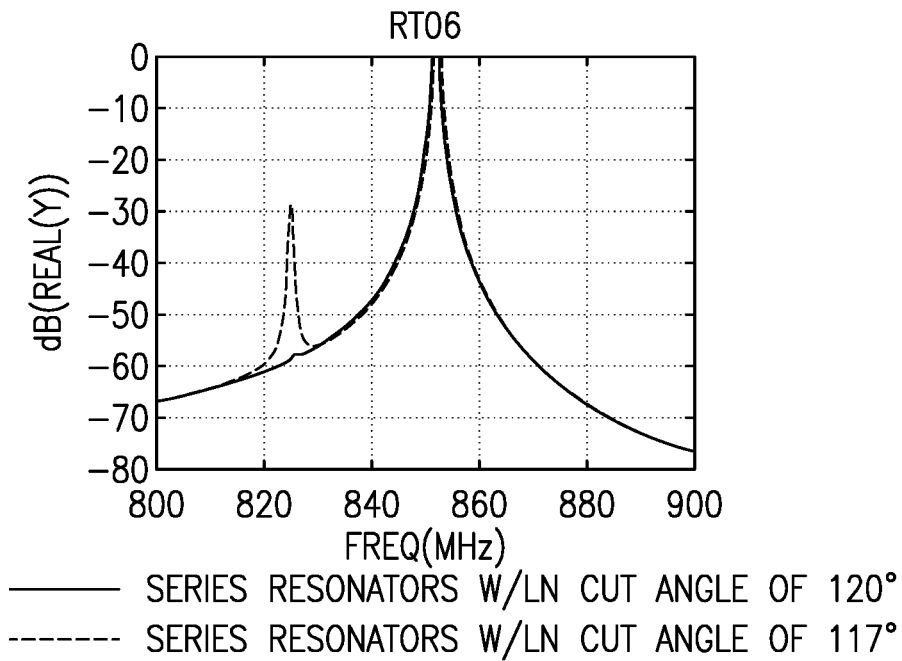
FIG. 7C illustrates a comparison between frequency responses of a third series resonator of a transmit filter of a duplexer formed on piezoelectric substrates having different cut angles.
Figure 7D:
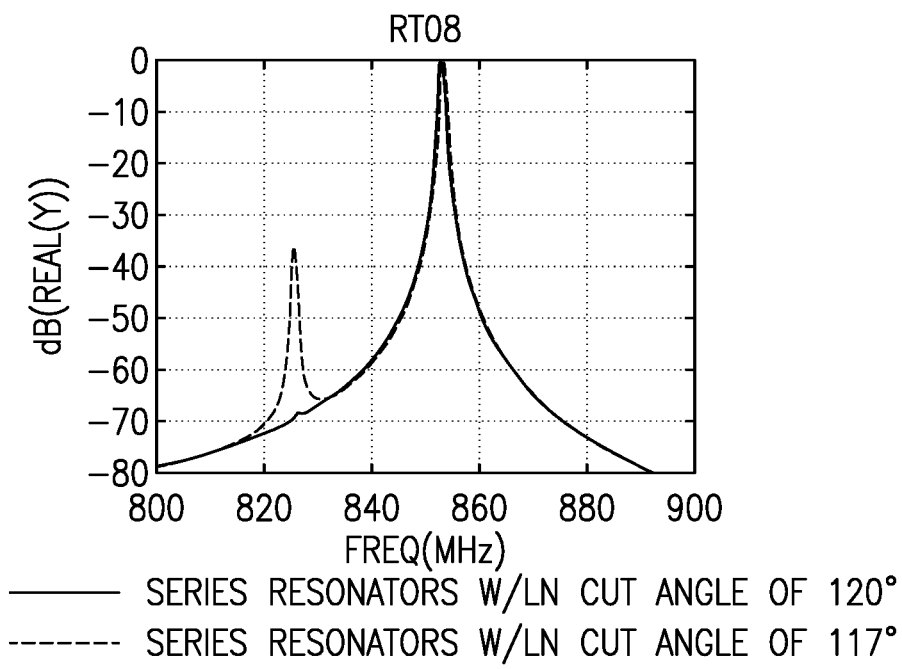
FIG. 7D illustrates a comparison between frequency responses of a fourth series resonator of a transmit filter of a duplexer formed on piezoelectric substrates having different cut angles.
Figure 7E:
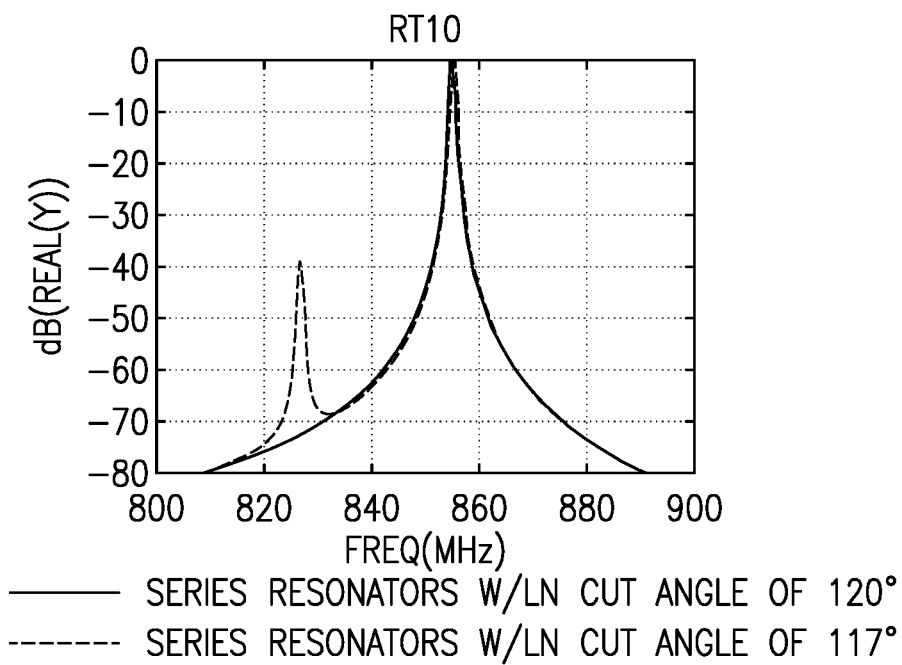
FIG. 7E illustrates a comparison between frequency responses of a fifth series resonator of a transmit filter of a duplexer formed on piezoelectric substrates having different cut angles.

If the transmit and receive filters of the duplexer were ideal they would pass only signals within the transmit and receive bands, respectively, and block all other signals. Such ideal filters would exhibit admittance curves such as illustrated in FIG. 6A with vertical sides or skirts at the lower and upper ends of the transmit and receive bands. Such ideal filters would exhibit infinite quality factors. Real filters, however, have finite quality factors and do not have admittance curves with vertical skirts, but rather have admittance curves that drop off gradually from the upper and lower ends of their passbands, as illustrated schematically in FIG. 6B. As can be seen in FIG. 6B, if the drop off in admittance is gradual and the transmit and receive bands utilized in a duplexer are close enough in frequency, the transmit filter may pass some signals in the receive band and the receive filter may pass some signals in the transmit band. This is referred to as crossover and is generally considered undesirable.

One technique that may be used to reduce the crossover between Tx and Rx filters in a duplexer may involve trimming the filter slope higher (for the lower skirt), or lower (for the high side skirt). This has direct impact on filter insertion loss (impacting noise figure for the Rx filter and ruggedness for the Tx filter). For a filter including SAW resonators, one may apply thicker $SiO_2$ on the IDT electrodes of the series and/or shunt resonators, depending on which side of the filter slope is to be improved, to reduce the effective electromechanical coupling, therefore improving the filter slope and reducing the amount of crossover. This method may result in an increase in insertion loss (IL) at the filter passband edges by 0.1-0.2 dB. For a filter including either SAW or BAW resonators, one may add capacitors in parallel with the series and/or shunt resonators, depending on which side of the filter slope is to be improved, to reduce the effective electromechanical coupling of the resonators, therefore improving the filter slope and reducing the crossover level. This method may also result in an increase in insertion loss (IL) at the filter passband edges by 0.1-0.2 dB. Another disadvantage of this method is additional die area is needed for the capacitors, therefore increasing the chip size. One may also utilize notch resonators to improve filter slope, therefore reducing the amount of crossover. The notch resonators may be configured as a shunt resonators, and one may align the notch resonator series resonance frequency at high edge of the filter passband. This method also has the disadvantage of increasing IL and increasing the chip size.

Various methods and structures to reduce the crossover between Tx and Rx filters in a duplexer as disclosed herein may avoid many of the disadvantages of the methods described above. In various embodiments, different spurious vibrational modes may be intentionally generated in one or more resonators based on either SAW or BAW technologies of a Tx and/or Rx filter of a duplexer to reduce crossover.

In one embodiment, one may control the piezoelectric substrate cut angle in a SAW resonator to control the amplitude of and to align frequencies of the shear horizontal spurious signals within the crossover region of a duplexer including the SAW resonator in a Tx or Rx filter.

In another embodiment, shear horizontal mode spurious signals may be generated and the frequency of such signals may be controlled in a modified TCSAW resonator by adding a high velocity layer (e.g., SiN) within the temperature compensating layer (e.g., $SiO_2$). The frequencies of the shear horizontal spurious signals may be aligned within the crossover region of a duplexer including the SAW resonator in a Tx or Rx filter.

In another embodiment, transverse spurious modes in TCSAW-based filters may be used to reduce the crossover, by designing the resonators which define the filter slope with narrow apertures (regions of overlap of the electrode fingers of the resonators) and no specific structures for causing the filters to operate in piston mode. The frequencies of the transverse spurious signals may be aligned within the crossover region of a duplexer including the TCSAW-based filter or filters.

In a further embodiment, thickness extension (TE) mode spurious signals in BAW resonators may be used to reduce the crossover, by controlling the recess frame (ReF) depth to separate the main resonance and TE spurious resonance caused by the ReF. The frequencies of the TE spurious modes may be aligned within the crossover region of a duplexer including the BAW resonators in Tx or Rx filters.

In accordance with the first embodiment described above, to reduce the crossover between temperature compensated SAW (TCSAW) Tx and Rx filters, the spurious shear horizontal (SH) modes from Tx series resonators are utilized to reduce the crossover level, by applying proper cut angles of the piezoelectric substrate (e.g., lithium niobate), while maintaining the other filter performance characteristics. Generation of shear spurious modes is generally undesirable for TCSAW filter designs, as these spurious vibrational modes may introduce discontinuities or ripples in the filter passband, and sometimes degrade isolation between filters. A proper material stack and/or cut angle of the piezoelectric substrate are thus typically picked to eliminate the SH modes from the resonators to achieve a clean passband and/or eliminate undesired spikes in Tx/Rx isolation. Contrary to this practice, in the first embodiment disclosed herein shear spurious modes in a TCSAW filter are intentionally generated and used to improve the filter performance. Specifically, a material stack and/or cut angle of piezoelectric substrate is intentionally picked to generate or enhance shear horizontal spurious mode signals in series resonators of a Tx filter of a duplexer. The frequencies at which the spurious modes appear are distributed to align with the crossover region of the Tx and Rx filters of the duplexer to reduce the amplitude of crossover signals in the duplexer.

Figure 8:
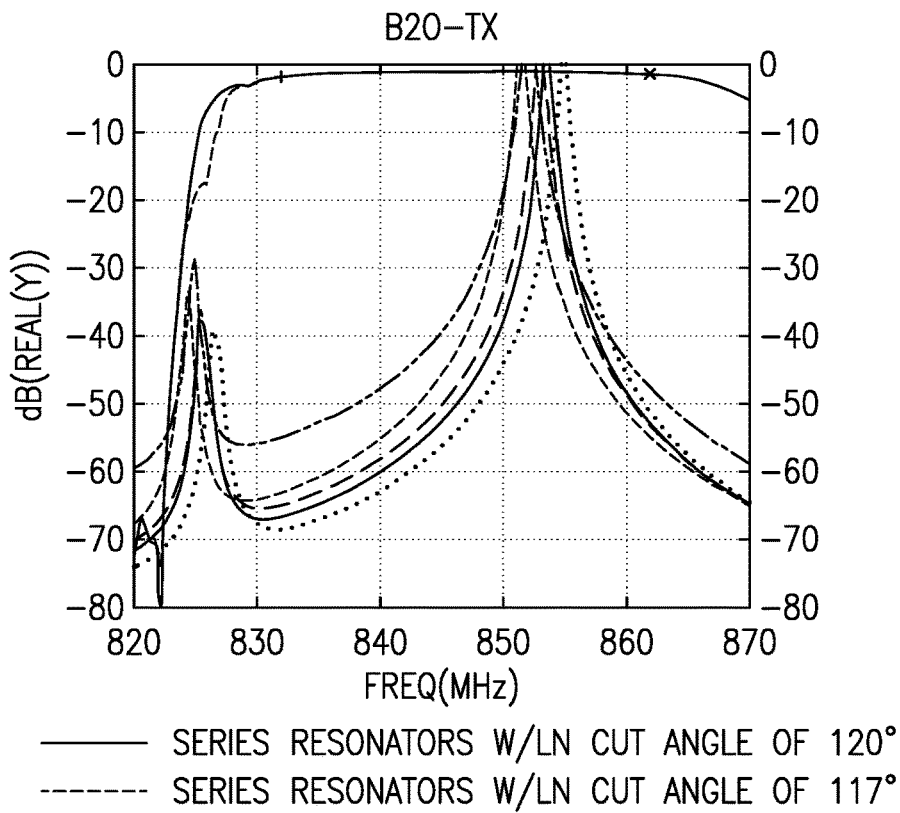
FIG. 8 illustrates the frequency responses of the first through fifth series resonators of an example of a transmit filter superimposed on admittance curves of examples of the transmit filter with the first through fifth series resonators formed on piezoelectric substrates having different cut angles.
Figure 9:
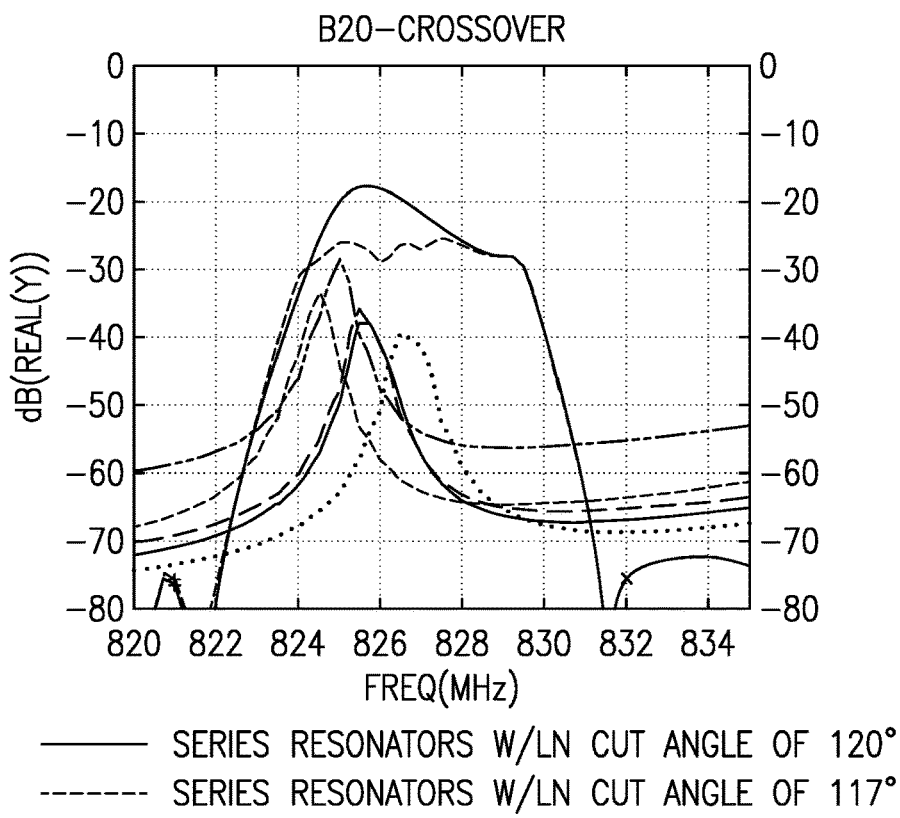
FIG. 9 illustrates spurious signals in the frequency responses of the first through fifth series resonators of an example of a transmit filter superimposed on isolation curves of a examples of duplexers with the first through fifth series resonators formed on piezoelectric substrates having different cut angles.

Simulations were performed of a B20 band duplexer design as illustrated in FIG. 5 using the aforementioned method to reduce crossover. The crossover region in the simulated duplexer extended from about 822 MHz to about 831 MHz. The series resonators rt02, rt04, rt06, rt08, and rt10 were simulated as being formed on a lithium niobate substrate with a cut angle of 117° to generate shear horizontal spurious mode signals in the frequency range of the crossover region. Plots illustrating the real admittance of these resonators as compared to resonators formed on lithium niobate substrates with a cut angles of 120° and generating no shear horizontal spurious mode signals are illustrated in FIGS. 7A-7E. A plot of the of the admittance curves of the series resonators rt02, rt04, rt06, rt08, and rt10 overlaid on a plot of the passband of the transmit filter is shown in FIG. 8. As illustrated, the presence of the shear horizontal spurious mode signals increased the insertion loss of the filter at the lower end of the passband, thus increasing the steepness of the lower skirt of the admittance curve. A plot of the shear horizontal spurious mode signals of the admittance curves of the series resonators rt02, rt04, rt06, rt08, and rt10 overlaid on an isolation plot of the simulated duplexer is illustrated in FIG. 9. The isolation plot illustrates the signal strength that passes between the RX and TX ports of the duplexer and can be considered an illustration of the amount of crossover exhibited by the duplexer. As shown in FIG. 9, the inclusion of the shear horizontal spurious mode signals of the series resonators rt02, rt04, rt06, rt08, and rt10 reduced the peak amount of crossover by 8 dB. Without wishing to be bound to a particular theory, this is believed to be due to the steepening of the lower side of the transmit passband, which reduced the amount by which the transmit and receive passbands of the Tx and Rx filters of the duplexer overlapped.

Figure 10:
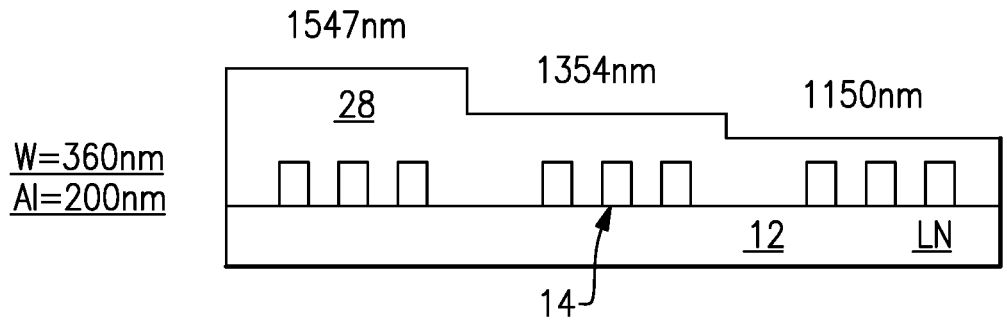
FIG. 10 is a cross-sectional diagram of portions of surface acoustic wave resonators having different thicknesses of temperature compensation layers.

Shear horizontal spurious mode signals in this simulation were simulated as being generated by switching the cut angle of the lithium niobate substrate of the series arm resonators of the transmit filter of the duplexer from 120° to 117°. Similar spurious mode signals could also be generated by modifying the thickness of the temperature compensating material layer (e.g., SiO$_2$), indicated at 28 in FIG. 10, of different resonators in the transmit filter.

Figure 11:
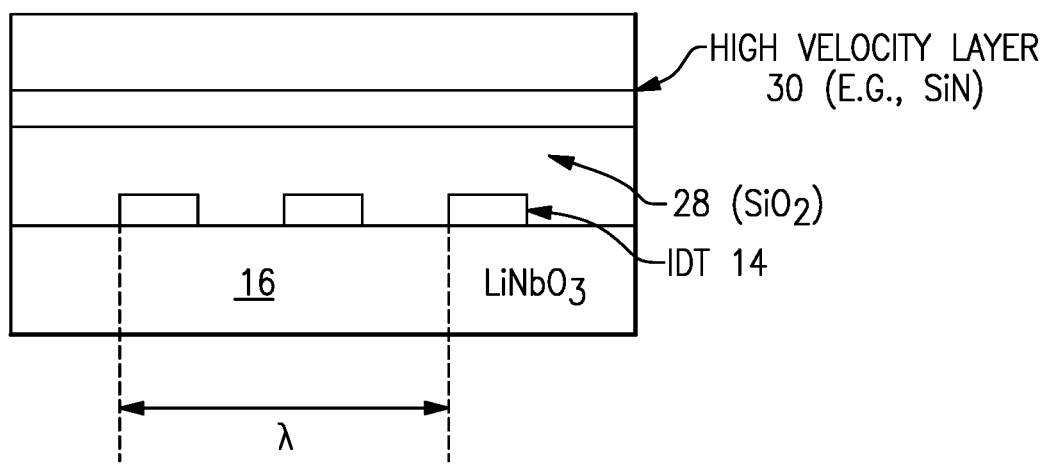
FIG. 11 is a cross-sectional diagram of a portion of a surface acoustic wave resonator including a layer of high velocity film disposed within a temperature compensation layer.
Figure 12A:
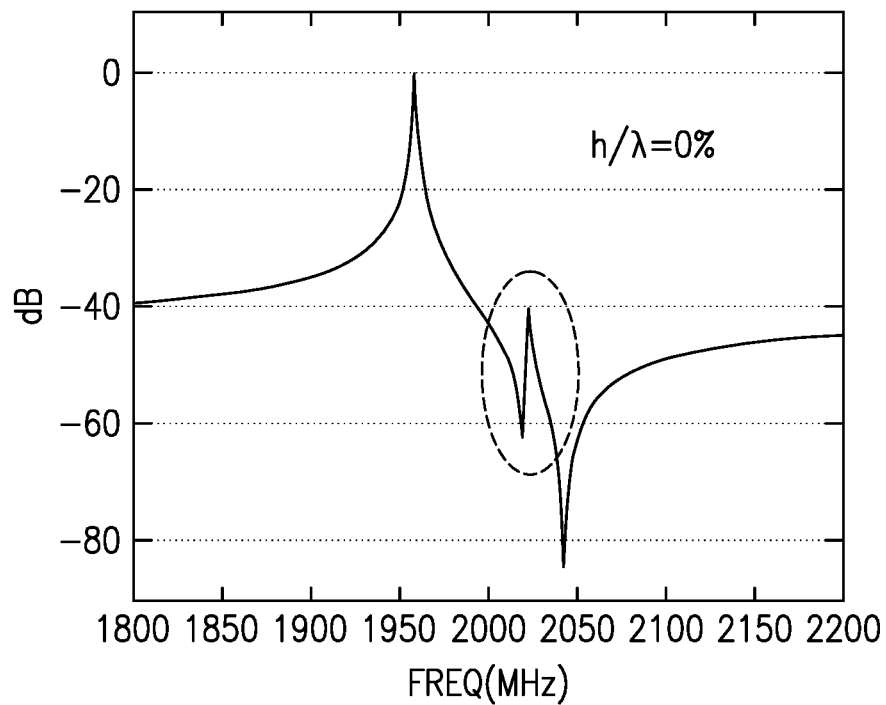
FIG. 12A illustrates the frequency response of an example of a SAW resonator with no high velocity film disposed within the temperature compensation layer.
Figure 12B:
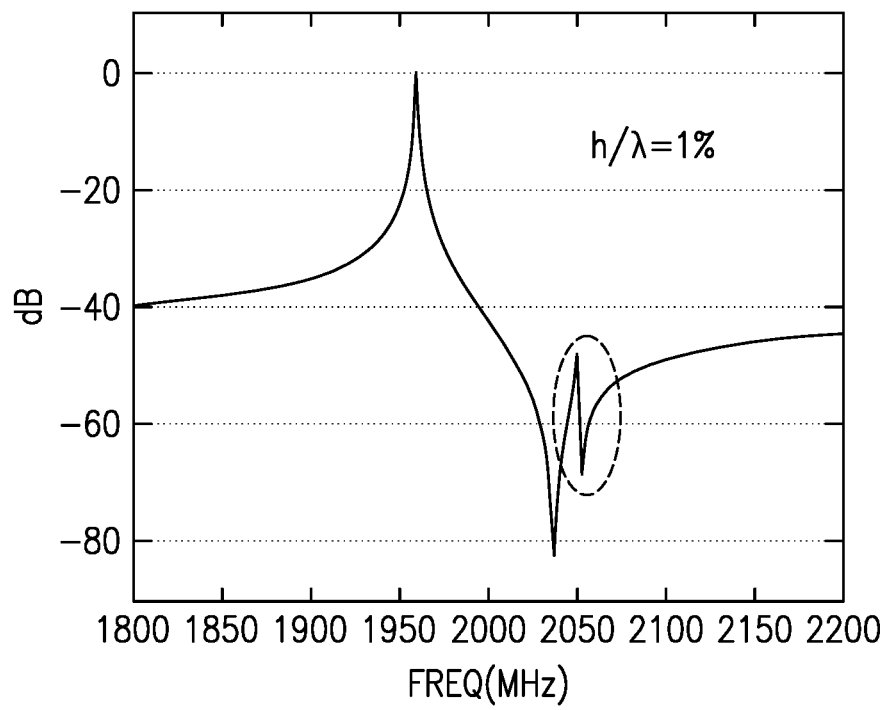
FIG. 12B illustrates the frequency response of an example of a SAW resonator with a high velocity film disposed within the temperature compensation layer.

In another embodiment, discussed briefly above, in a duplexer with Tx or Rx filters including TCSAW resonators, a layer of a material 30 (a "high velocity layer," for example, silicon nitride (SiN)) having a higher acoustic velocity than the acoustic velocity of the temperature compensating material may be disposed within the layer of temperature compensating material. An example of this is shown in cross-section in FIG. 11. This high velocity layer may cause the TCSAW resonator to exhibit a shear mode spurious signal in its admittance curve. The frequency at which the shear mode spurious signal occurs may be selected by selecting a particular relative thickness h/λ of the high velocity layer (λ being the wavelength of the main acoustic wave generated by the resonator) as illustrated by comparing the plots of FIGS. 12A and 12B. As illustrated, the frequency at which the spurious signal appears in the admittance curve of the resonator is shifted upward when the high velocity layer has a relative thickness of 1% as compared to a resonator lacking the high velocity layer (h/λ=0). The resonators including the high velocity layer may be series resonators of a ladder filter defining the Tx or Rx filters. Different resonators of the filter may include high velocity layers with different thicknesses or heights within the temperature compensation layer and may thus generate shear mode spurious signals at different frequencies. As discussed with respect to the previous embodiment and as illustrated in FIGS. 8 and 9, the frequency or frequencies at which the spurious signals occur may be aligned with the frequency band at which the crossover of a duplexer including the TCSAW filter occurs to increase the steepness of the passband skirt of the TCSAW filter and reduce the magnitude of the crossover signal.

Figure 13:
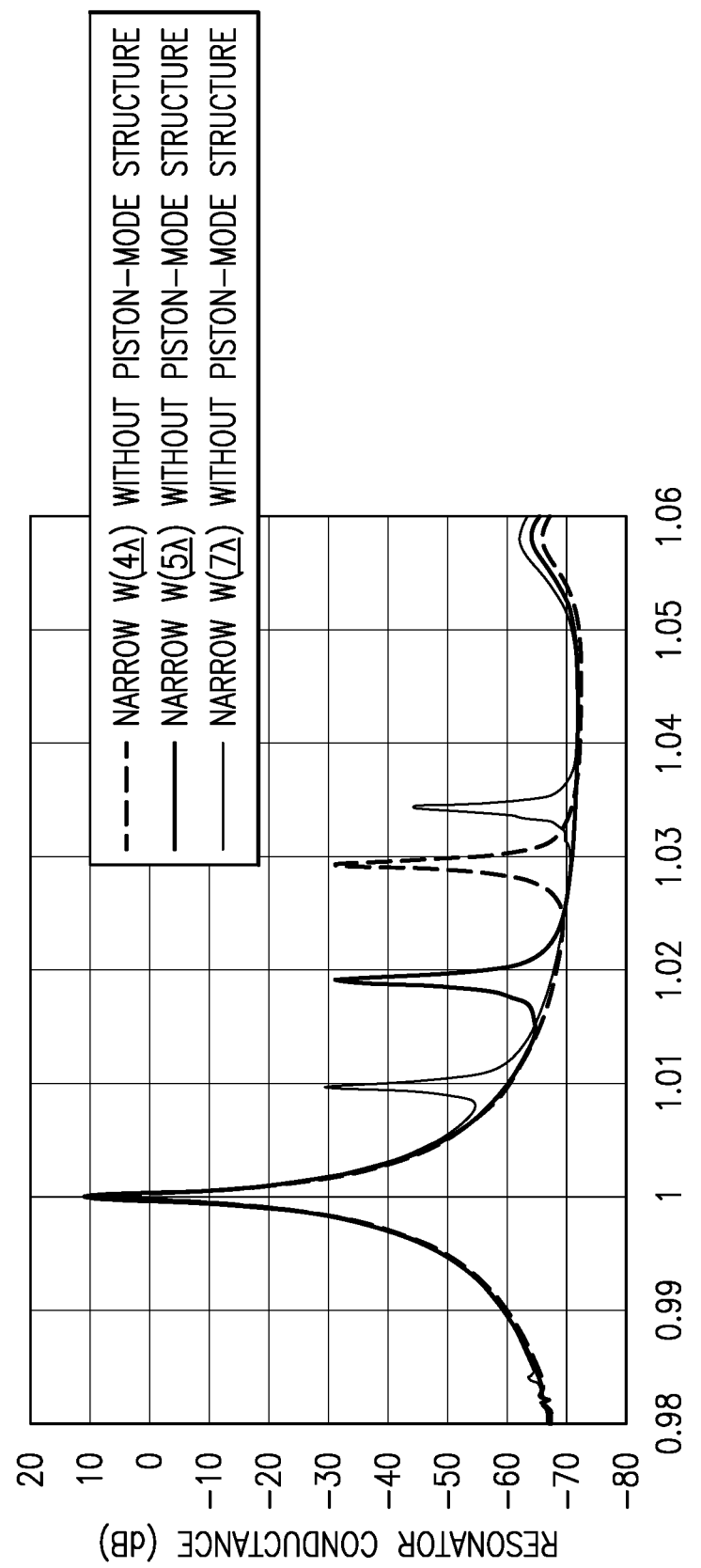
FIG. 13 illustrates frequency responses of examples of SAW resonators having narrow apertures and no piston mode structures.

In another embodiment, discussed briefly above, in a duplexer with Tx or Rx filters including SAW resonators or TCSAW resonators, the apertures of one or more of the series resonators may be formed with narrow apertures, for example, with apertures having widths in the direction parallel to the lengthwise extension of the electrode fingers of 10λ or less. Additionally, one or more of the resonators in the Tx or Rx filter may be formed without structures that cause the one or more resonators to operate in piston mode. Such structures may include, for example, strips of a material with a higher acoustic velocity than the temperature compensating material of the resonators disposed over the gap regions between ends of electrode fingers and the opposing bus bar electrode, strips of material with a higher density than the density of the temperature compensating material disposed in the temperature compensating material over tips of the electrode fingers or in the gap regions of the resonators, etc. These types of structures may be included in certain resonator designs to cause the resonators to operate in piston mode and reduce or eliminate the generation of transverse mode spurious signals. Without including such structures, and/or by designing the SAW resonators with narrow apertures, transverse mode spurious signals may be generated or enhanced. The frequency or frequencies at which these transverse mode spurious signals occur may be a function of the aperture width. FIG. 13 illustrates the relative frequencies f/f$_0$, f$_0$ being the resonance frequency of an example SAW resonator, at which transverse mode spurious signals may be generated. FIG. 13 shows that the spurious signal appears at a higher frequency as the aperture width W of the resonator is changed from 5λ to 4λ. For an aperture width of 7λ, spurious mode signals appear at two different frequencies, one below the frequencies at which the spurious mode signals occur in the examples having aperture widths of 5λ or 4λ and a second above the frequencies at which the spurious mode signals occur in the examples having aperture widths of 5λ or 4λ. Different resonators in a filter may have different aperture widths and may generate spurious signals at different frequencies. One may tune the frequency at which the spurious mode signals occur so that they are within the frequency range of crossover of the Tx and Rx filters of the duplexer and these spurious mode signals may be utilized to steepen the skirt of the passband of the Tx or Rx filter and reduce the magnitude of the crossover signal in a similar manner as described above with respect to the first embodiment and FIGS. 8 and 9.

Figure 14A:
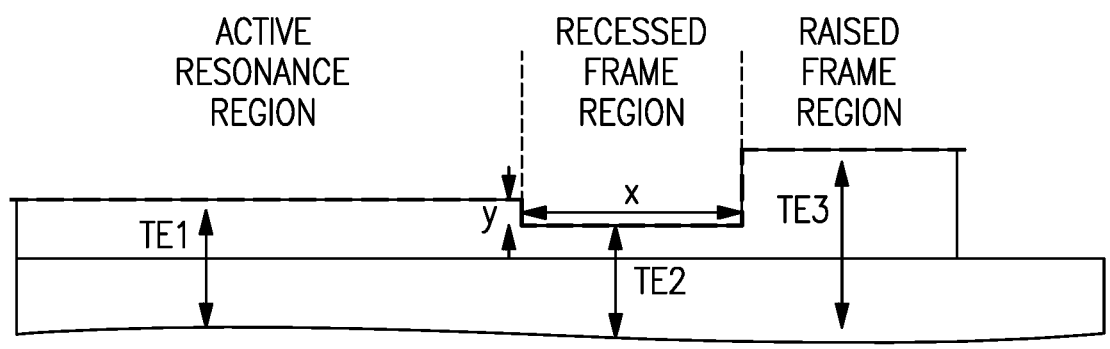
FIG. 14A illustrates an example of a frame structure of a BAW resonator configured to suppress the generation of spurious thickness extension mode signals.

In another embodiment, discussed briefly above, in a duplexer with Tx or Rx filters including BAW resonators, for example, FBARs or SMRs, the configuration of the frame regions of one or more of the series resonators and/or shunt resonators may be defined to generate thickness extension mode spurious signals that may be used as described above to steepen the skirts of the Tx or Rx filters and reduce the magnitude of the crossover signal in the duplexer. An example of a frame structure that may be used in BAW resonators to suppress thickness extension mode spurious signals is illustrated in FIG. 14A. FIG. 14A illustrates one side of the upper portion of the BAW resonator and illustrates a recessed frame region TE2 disposed outside the active region TE1 of the resonator and a raised frame region TE3 disposed outside of the recessed frame region. The configuration of the frame structure may be defined by regions of different thickness of oxide and/or metal in the recessed frame region and raised frame region. A similar structure is illustrated in the example of the FBAR in FIG. 2, and although not illustrated in FIG. 4, may also be utilized in examples of SMRs. The depth y and width x of the recessed frame region TE2 in the frame configuration of FIG. 14A, as well as the dimensions of the raised frame region TE3 are selected to suppress the generation of thickness extension mode spurious signals in the BAW resonator.

Figure 14B:
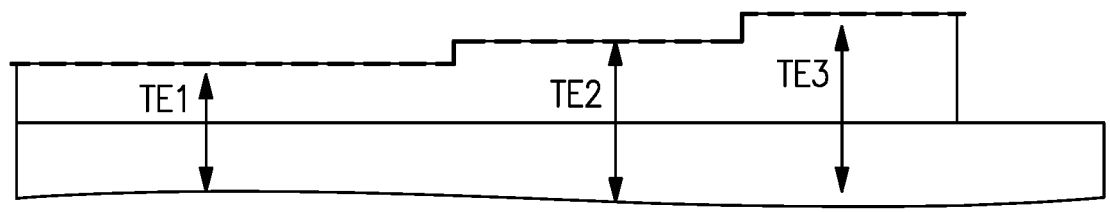
FIG. 14B illustrates an example of a frame structure of a BAW resonator configured to generate spurious thickness extension mode signals.
Figure 14C:
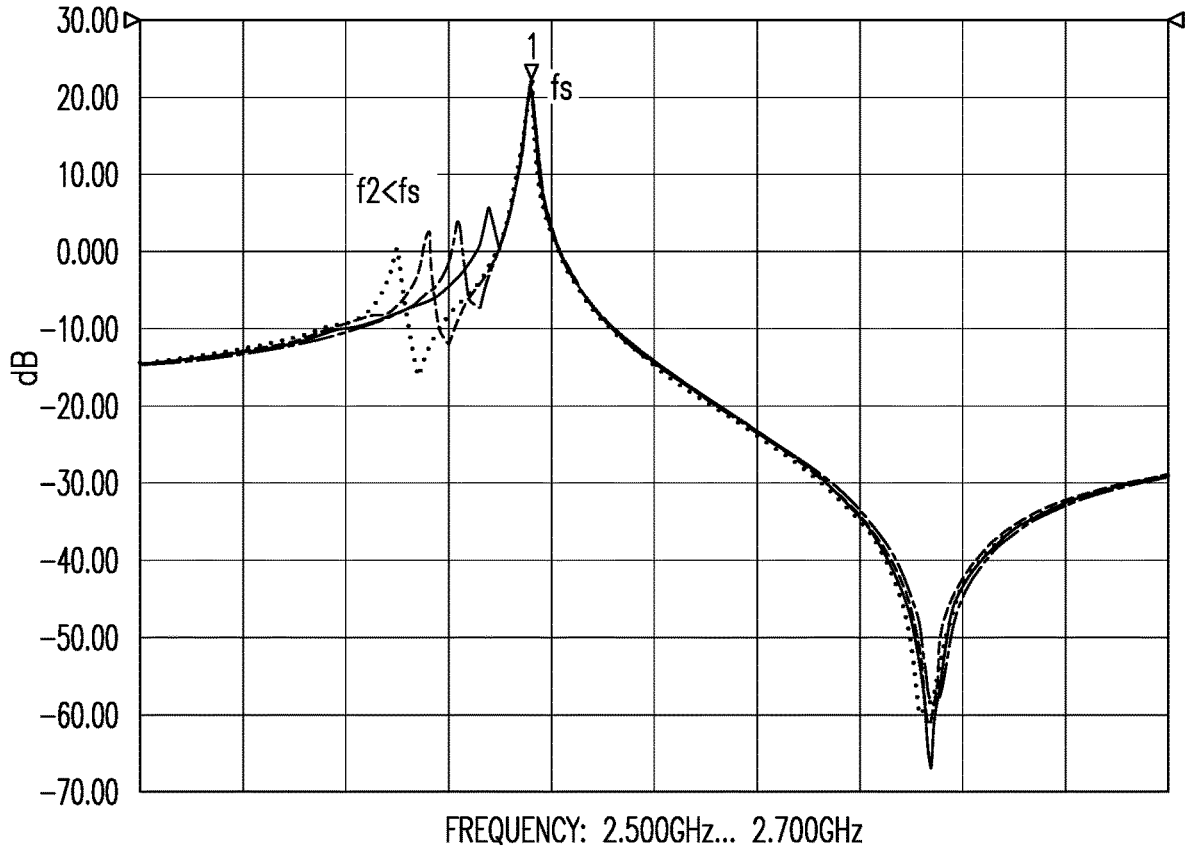
FIG. 14C illustrates results of a simulation of frequency response of examples of BAW resonators having frame structures as illustrated in FIG. 14B.

To instead cause thickness extension mode spurious signals to be generated in the BAW resonator one may adjust the dimensions of the recessed frame structure TE2. In FIG. 14B, for example, the recessed frame region TE2 includes a frame structure having a thickness greater than the thickness of the active region TE1 structure. The recessed frame region TE2 thus no longer includes a recess, but rather a raised portion. The width of the recessed frame region may be the same as that in the configuration of FIG. 14A. Including a raised frame rather than a recess in what is the recessed frame region TE2 in the structure of FIG. 14A causes a thickness extension mode spurious signal with a frequency f$_2$ lower than the resonance frequency f$_s$ of the BAW resonator to be generated. The frequency f$_2$ at which the thickness extension mode spurious signal occurs may be controlled by controlling the thickness of the raised region TE2. A BAW resonator configured with the frame structure of FIG. 14B may be a series filter in a transmit filter of the duplexer having a ladder filter configuration. FIG. 14C illustrates a simulated frequency response curve for a BAW resonator including a raised structure in the recessed frame region TE2. The different frequencies f$_2$ at which the simulated spurious signals occur correspond to different thicknesses of the raised structure in the recessed frame region TE2. A single filter may include different resonators with different thicknesses of the raised structure in the recessed frame region TE2 to generate spurious signals at different frequencies within the range of frequencies of the crossover of the duplexer.

Figure 14D:
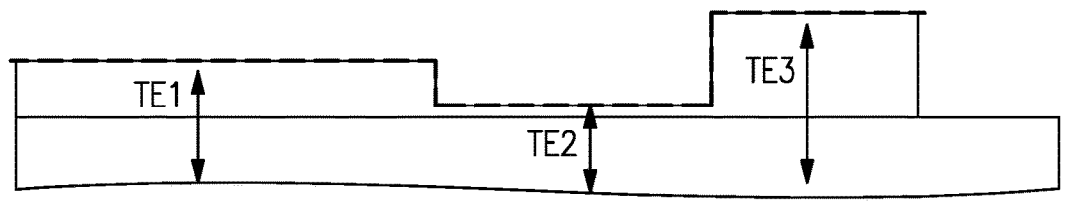
FIG. 14D illustrates another example of a frame structure of a BAW resonator configured to generate spurious thickness extension mode signals.
Figure 14E:
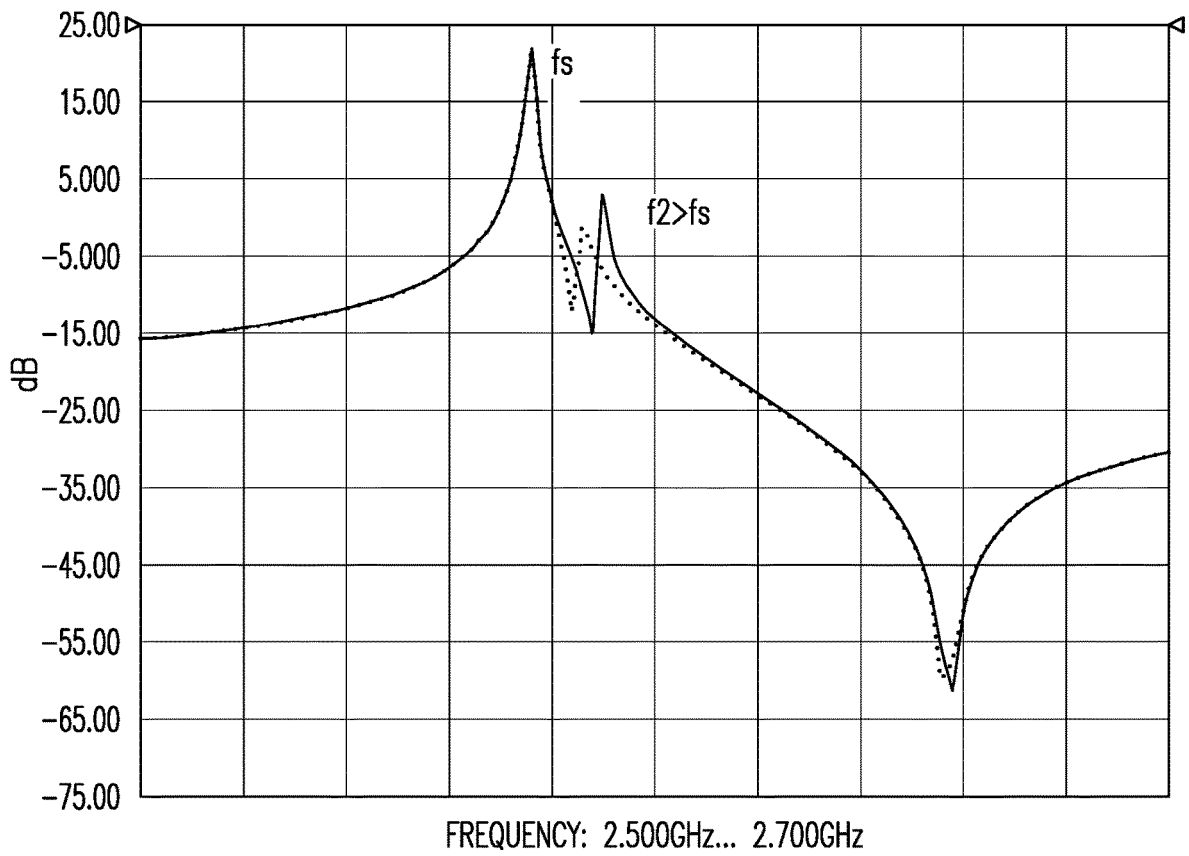
FIG. 14E illustrates results of a simulation of frequency response of examples of BAW resonators having frame structures as illustrated in FIG. 14D.

One may also cause thickness extension mode spurious signals to be generated in the BAW resonator by thinning the frame structure in the recessed frame region TE2 as compared to the recessed frame structure illustrated in FIG. 14A. One example of this is shown in FIG. 14D. In the example of FIG. 14D the frame structure in the recessed frame region TE2 is even thinner than the active region structure TE1 than in the example of FIG. 14A. Configuring the frame structure in the recessed frame region TE2 to be thinner than a thickness that would suppress spurious mode signal generation may cause thickness extension mode spurious signals to be generated in the BAW resonator at a frequency $f_2$ higher than the resonance frequency $f_s$ of the BAW resonator to be generated. A BAW resonator configured with the frame structure of FIG. 14B may be a series filter in a receive filter of the duplexer having a ladder filter configuration. The frequency $f_2$ at which the thickness extension mode spurious signal occurs may be controlled by controlling the thickness of the raised region TE2. FIG. 14D illustrates a simulated frequency response curve for a BAW resonator including a more deeply recessed structure in the recessed frame region TE2 than in the example of FIG. 14A. The different frequencies $f_2$ at which the simulated spurious signals occur correspond to different thicknesses of the deeply recessed structure in the recessed frame region TE2. A single filter may include different resonators with different thicknesses of the deeply recessed structure in the recessed frame region TE2 to generate spurious signals at different frequencies within the range of frequencies of the crossover of the duplexer.

As in the previous embodiments, one may tune the frequency or frequencies at which the spurious mode signals occur so that they are within the frequency range of crossover of the Tx and Rx filters of the duplexer and these spurious mode signals may be utilized to steepen the skirt of the passband of the Tx or Rx filter and reduce the magnitude of the crossover signal in a similar manner as described above with respect to the first embodiment and FIGS. 8 and 9.

The embodiments and examples described above include resonators in the transmit filter of a duplexer that generate spurious signals within the frequency range of crossover of the duplexer. It is to be understood that these embodiments and examples may also be applied to the receive filter of the duplexer such that one or more resonators in the receive filter of the duplexer generates spurious signals within the frequency range of crossover of the duplexer. For example, in embodiments in which the duplexer operates with a receive passband that is lower than the transmit passband the embodiment described with reference to FIGS. 11, 12A, and 12B or with reference to FIG. 13 may be more appropriately applied to the receive filter than to the transmit filter.

Various examples and embodiments of the acoustic wave filters and duplexers including same as disclosed herein can be used in a wide variety of electronic devices, such as RF front-end modules and communication devices.

Figure 15:
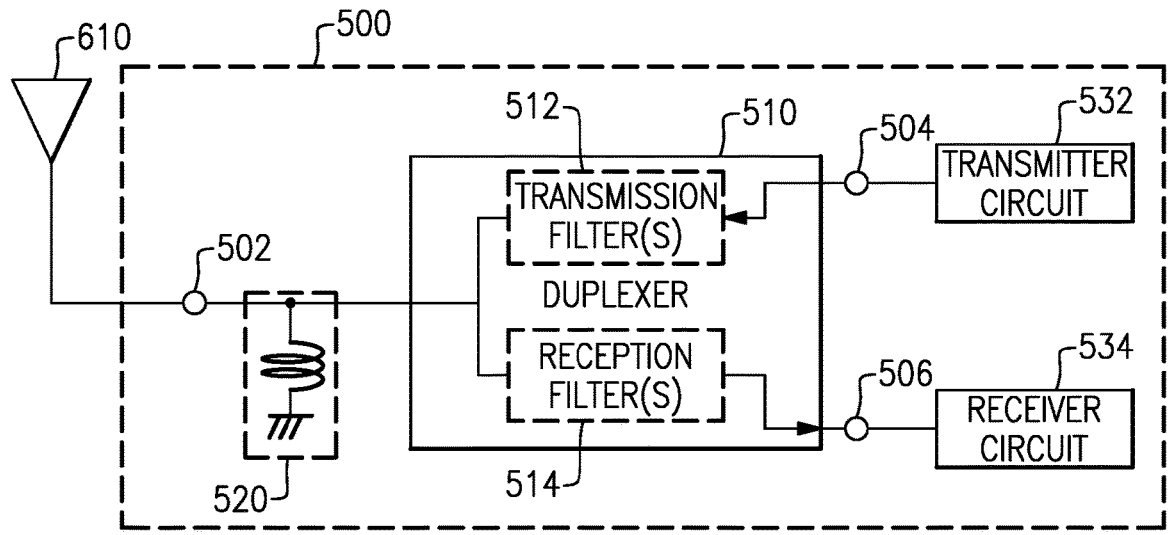
FIG. 15 is a block diagram of one example of a front-end module that can include one or more duplexers according to aspects of the present disclosure.

Referring to FIG. 15, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW and/or BAW filters disclosed herein can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 15, however, in other embodiments these components may be integrated into a common transceiver circuit or module. As will be appreciated by those skilled in the art, the front-end module 400 may include other components that are not illustrated in FIG. 15 including, but not limited to, switches, electromagnetic couplers, amplifiers, processors, and the like.

Figure 16:
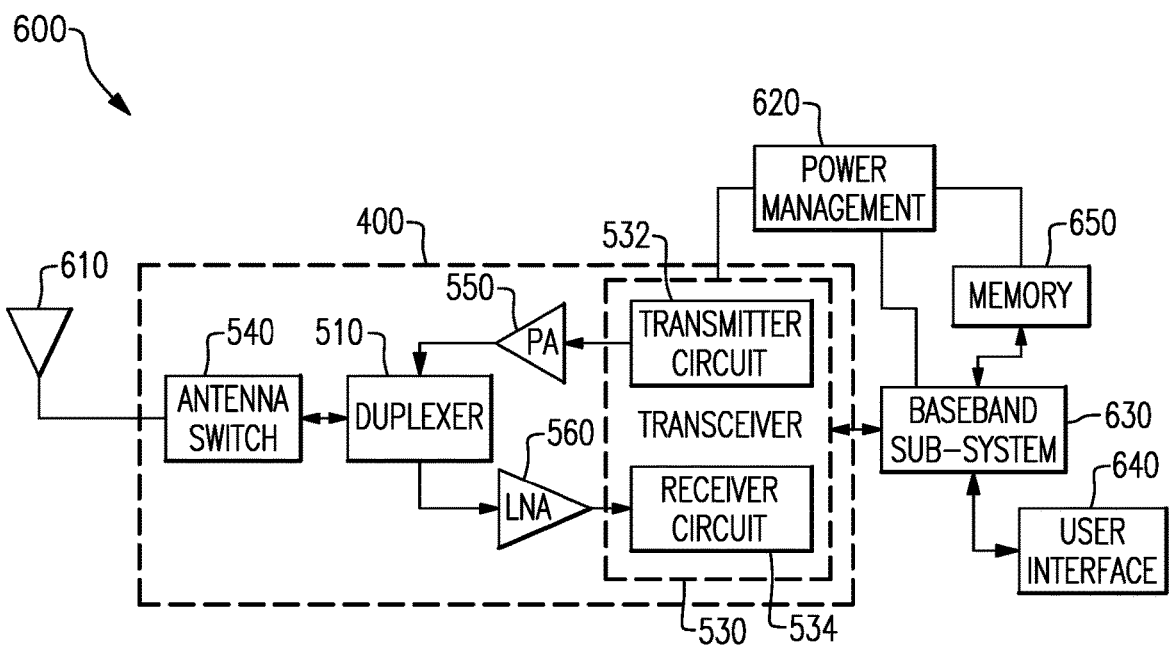
FIG. 16 is a block diagram of one example of a wireless device including the front-end module of FIG. 15.

FIG. 16 is a block diagram of one example of a wireless device 500 including the antenna duplexer 410 shown in FIG. 15. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 15. The front-end module 400 includes the duplexer 410, as discussed above. In the example shown in FIG. 16 the front-end module 400 further includes an antenna switch 440, which can be configured to switch between different frequency bands or modes, such as transmit and receive modes, for example. In the example illustrated in FIG. 16, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 16.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 16, the front-end module 400 may further include a low noise amplifier module 460, which amplifies received signals from the antenna 510 and provides the amplified signals to the receiver circuit 434 of the transceiver 430.

The wireless device 500 of FIG. 16 further includes a power management sub-system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 5 GHz, such as in a range from about 600 MHz to 2.7 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:
1. A radio frequency duplexer comprising:
a transmit filter including a first plurality of acoustic wave resonators; and
a receive filter including a second plurality of acoustic wave resonators, the transmit filter exhibiting a transmit insertion loss curve that partially overlaps with a receive insertion loss curve of the receive filter, a frequency range of an overlap of the transmit insertion loss curve and the receive insertion loss curve defining a frequency range of crossover of the duplexer, at least one of the first plurality of acoustic wave resonators or the second plurality of acoustic wave resonators including a structure configured to generate a spurious signal at a frequency within the frequency range of the crossover to reduce an amplitude of an interference signal within the frequency range of the crossover, the structure including one of a surface acoustic wave resonator of one of the first or second plurality of acoustic wave resonators formed with a piezoelectric substrate having a cut angle configured to generate a shear horizontal mode spurious signal having the frequency within the frequency range of the crossover, or different ones of the surface acoustic wave resonator of one of the first or second plurality of acoustic wave resonators including temperature compensation layers with different thicknesses.

2. The duplexer of claim 1 wherein the structure includes a plurality of surface acoustic wave resonators of the one of the first or second plurality of acoustic wave resonators formed with the piezoelectric substrate having the cut angle configured to generate shear horizontal mode spurious signals having a plurality of frequencies within the frequency range of the crossover.

3. The duplexer of claim 2 wherein the one of the transmit or receive filters comprises a ladder filter.

4. The duplexer of claim 3 wherein the plurality of surface acoustic wave resonators of the one of the first or second plurality of acoustic wave resonators are series resonators of the ladder filter.

5. The duplexer of claim 1 wherein the structure includes a surface acoustic wave resonator of one of the first or second plurality of acoustic wave resonators including a temperature compensation layer and a layer of high velocity material disposed within the temperature compensation layer and exhibiting a greater acoustic velocity than a material of the temperature compensation layer.

6. The duplexer of claim 5 wherein the structure includes a plurality of surface acoustic wave resonators of the one of the first or second plurality of acoustic wave resonators including a temperature compensation layer and a layer of the high velocity material disposed within the temperature compensation layer.

7. The duplexer of claim 6 wherein thicknesses of the layers of high velocity material in different ones of the plurality of surface acoustic wave resonators of the one of the first or second plurality of acoustic wave resonators are different.

8. The duplexer of claim 7 wherein the one of the transmit or receive filters comprises a ladder filter.

9. The duplexer of claim 8 wherein the plurality of surface acoustic wave resonators of the one of the first or second plurality of acoustic wave resonators are series resonators of the ladder filter.

10. The duplexer of claim 1 wherein the structure includes a surface acoustic wave resonator of one of the first or second plurality of acoustic wave resonators including an aperture having a width of 10λ or less.

11. The duplexer of claim 10 wherein the surface acoustic wave resonator of the one of the first or second plurality of acoustic wave resonators generates spurious transverse mode signals at more than one frequency.

12. The duplexer of claim 10 wherein the surface acoustic wave resonator of the one of the first or second plurality of acoustic wave resonators lacks structures configured to cause the surface acoustic wave resonator to operate in piston mode.

13. The duplexer of claim 10 wherein the structure includes a plurality of surface acoustic wave resonators of the one of the first or second plurality of acoustic wave resonators including apertures having widths of 10λ or less.

14. The duplexer of claim 13 wherein different ones of the plurality of surface acoustic wave resonators of the one of the first or second plurality of acoustic wave resonators include apertures having different widths.

15. The duplexer of claim 1 wherein the structure includes a bulk acoustic wave resonator of one of the first or second plurality of acoustic wave resonators including a piezoelectric film, an active region, and a recessed frame region surrounding the active region, the recessed frame region having a recessed frame structure disposed on the piezoelectric film, the active region having an active region structure disposed on the piezoelectric film, the recessed frame structure having a thickness greater than a thickness of the active region structure.

16. The duplexer of claim 15 wherein the structure includes a plurality of bulk acoustic wave resonators of the one of the first or second plurality of acoustic wave resonators, each of the plurality of bulk acoustic wave resonators of the one of the first or second plurality of acoustic wave resonators having recessed frame structures with different thicknesses.

17. The duplexer of claim 1 wherein the structure includes a bulk acoustic wave resonator of one of the first or second plurality of acoustic wave resonators including a piezoelectric film, an active region, and a recessed frame region surrounding the active region, the recessed frame region having a recessed frame structure disposed on the piezoelectric film, the active region having an active region structure disposed on the piezoelectric film, the recessed frame structure having a thickness sufficiently less than a thickness of the active region structure to cause the bulk acoustic wave resonator to generate a spurious thickness extension mode signal at a frequency greater than a resonance frequency of the bulk acoustic wave resonator.

18. The duplexer of claim 17 wherein the structure includes a plurality of bulk acoustic wave resonators of the one of the first or second plurality of acoustic wave resonators, each of the plurality of acoustic wave resonators of the one of the first or second plurality of acoustic wave resonators having recessed frame structures with different thicknesses and configured to generate spurious thickness extension mode signals at different frequencies greater than the resonance frequency of the bulk acoustic wave resonator.

19. A radio frequency device module comprising a radio frequency duplexer including a transmit filter including a first plurality of acoustic wave resonators, and a receive filter including a second plurality of acoustic wave resonators, the transmit filter exhibiting a transmit insertion loss curve that partially overlaps with a receive insertion loss curve of the receive filter, a frequency range of an overlap of the transmit insertion loss curve and the receive insertion loss curve defining a frequency range of crossover of the duplexer, at least one of the first plurality of acoustic wave resonators or the second plurality of acoustic wave resonators including a structure configured to generate a spurious signal at a frequency within the frequency range of the crossover to reduce an amplitude of an interference signal within the frequency range of the crossover, the structure including one of a surface acoustic wave resonator of one of the first or second plurality of acoustic wave resonators including a temperature compensation layer and a layer of high velocity material disposed within the temperature compensation layer and exhibiting a greater acoustic velocity than a material of the temperature compensation layer, or a surface acoustic wave resonator of one of the first or second plurality of acoustic wave resonators including an aperture having a width of 10λ or less.

20. A radio frequency device including a radio frequency device module comprising a radio frequency duplexer including a transmit filter including a first plurality of acoustic wave resonators, and a receive filter including a second plurality of acoustic wave resonators, the transmit filter exhibiting a transmit insertion loss curve that partially overlaps with a receive insertion loss curve of the receive filter, a frequency range of an overlap of the transmit insertion loss curve and the receive insertion loss curve defining a frequency range of crossover of the duplexer, at least one of the first plurality of acoustic wave resonators or the second plurality of acoustic wave resonators including a structure configured to generate a spurious signal at a frequency within the frequency range of the crossover to reduce an amplitude of an interference signal within the frequency range of the crossover, the structure including one of a bulk acoustic wave resonator of one of the first or second plurality of acoustic wave resonators including a piezoelectric film, an active region, and a recessed frame region surrounding the active region, the recessed frame region having a recessed frame structure disposed on the piezoelectric film, the active region having an active region structure disposed on the piezoelectric film, the recessed frame structure having a thickness greater than a thickness of the active region structure, or a bulk acoustic wave resonator of one of the first or second plurality of acoustic wave resonators including a piezoelectric film, an active region, and a recessed frame region surrounding the active region, the recessed frame region having a recessed frame structure disposed on the piezoelectric film, the active region having an active region structure disposed on the piezoelectric film, the recessed frame structure having a thickness sufficiently less than a thickness of the active region structure to cause the bulk acoustic wave resonator to generate a spurious thickness extension mode signal at a frequency greater than a resonance frequency of the bulk acoustic wave resonator.

* * * * *